(12) United States Patent
Zhao et al.

(10) Patent No.: US 10,312,265 B2
(45) Date of Patent: Jun. 4, 2019

(54) ARRAY SUBSTRATE AND MANUFACTURING METHOD OF ARRAY SUBSTRATE FOR REDUCING ELECTRIC FIELD INTERFERENCE

(71) Applicant: Shenzhen China Star Optoelectronics Semiconductor Display Technology Co., Ltd., Shenzhen, Guangdong (CN)

(72) Inventors: Yang Zhao, Guangdong (CN); Jianhong Chen, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/739,732

(22) PCT Filed: Sep. 21, 2017

(86) PCT No.: PCT/CN2017/102614
§ 371 (c)(1),
(2) Date: Dec. 24, 2017

(87) PCT Pub. No.: WO2019/033505
PCT Pub. Date: Feb. 21, 2019

(65) Prior Publication Data
US 2019/0057976 A1 Feb. 21, 2019

(51) Int. Cl.
*H01L 27/12* (2006.01)
*G02F 1/1335* (2006.01)
(Continued)

(52) U.S. Cl.
CPC .......... *H01L 27/124* (2013.01); *G02F 1/1368* (2013.01); *G02F 1/133514* (2013.01); *G02F 1/136286* (2013.01); *H01L 27/1262* (2013.01); *G02F 2201/121* (2013.01); *G02F 2201/123* (2013.01)

(58) Field of Classification Search
None
See application file for complete search history.

(56) References Cited

U.S. PATENT DOCUMENTS

2015/0268503 A1* 9/2015 Son ................... G02F 1/136286 349/43
2015/0362811 A1* 12/2015 Huang ................ H01L 27/1225 438/104
2017/0235193 A1* 8/2017 Meng ................ G02F 1/133345 257/72

FOREIGN PATENT DOCUMENTS

CN 103676373 A 3/2014
CN 103715206 A 4/2014
(Continued)

*Primary Examiner* — Daniel Whalen
(74) *Attorney, Agent, or Firm* — Andrew C. Cheng

(57) ABSTRACT

The present invention provides an array substrate and a manufacturing method thereof. The array substrate includes: a base substrate; a TFT on the base substrate, a data line electrically connected with a source of the TFT, a transparent conductive layer between the data line and the pixel electrode, a pixel electrode electrically connected with a drain of the TFT, wherein the data line and the pixel electrode are set on different layers, and the data line, the transparent conductive layer, and the pixel electrode are laminated and insulating to each other. It reduces electric field interference generated by the data line to the pixel electrode by the array substrate of the present invention.

10 Claims, 2 Drawing Sheets

(51) Int. Cl.
    *G02F 1/1362*     (2006.01)
    *G02F 1/1368*     (2006.01)

(56) References Cited

FOREIGN PATENT DOCUMENTS

| | | | |
|---|---|---|---|
| CN | 104142592 | A | 11/2014 |
| CN | 105116582 | A | 12/2015 |
| CN | 105336747 | A | 2/2016 |
| CN | 106773403 | A | 5/2017 |
| JP | 2016053637 | A | 4/2016 |

\* cited by examiner

… (1)

ARRAY SUBSTRATE AND MANUFACTURING METHOD OF ARRAY SUBSTRATE FOR REDUCING ELECTRIC FIELD INTERFERENCE

FIELD OF THE DISCLOSURE

The present invention relates to display field, and more particularly, to an array substrate and a manufacturing method thereof.

BACKGROUND

With development of display technique, a flat display device as a liquid crystal display (LCD) has advantages such as high definition, energy saving, thin body, and extensive appliance. It is extensively applied to each consumer electronic products such as a cell phone, a television, a personal digital assistant, a digital camera, and a laptop, and becomes mainstream of the display device.

At present, with improvement of resolution of the LCD, dimension of a single pixel becomes smaller so the distance between a pixel electrode and a data line becomes smaller. The pixel electrode has to overlap entirety or a part of the data line in order to ensure enough aperture ratio and size of a liquid crystal capacitor for an ultra-high resolution panel.

In long-term research, the inventor of the present invention finds that the pixel electrode is easy to be influenced by electric field coupling resulted from the data line in the present display panel structure. Thus, pictures of the display panel easily generates crosstalk.

SUMMARY

The present invention provides an array substrate and a manufacturing method thereof. It reduces electric field interference generated by the data line to the pixel electrode.

For solving the problem above, the present invention adopts an embodiment providing an array substrate. The array substrate includes: a base substrate; a thin-film transistor (TFT) on the base substrate, comprising a source and a drain; a data line electrically connected with the source; a pixel electrode electrically connected with the drain; and a transparent conductive layer between the data line and the pixel electrode, including a through hole, wherein the pixel electrode is electrically connected with the drain by the through hole, wherein the data line and the pixel electrode are set on different layers, a vertical projection of the data line overlaps that of the pixel electrode at the same flat, and the data line, the transparent conductive layer, and the pixel electrode are laminated and insulating to each other.

For solving the problem above, the present invention adopts another embodiment providing an array substrate. The array substrate includes: a base substrate; a thin-film transistor (TFT) on the base substrate, comprising a source and a drain; a data line electrically connected with the source; a pixel electrode electrically connected with the drain; and a transparent conductive layer between the data line and the pixel electrode, wherein the data line and the pixel electrode are set on different layers, and the data line, the transparent conductive layer, and the pixel electrode are laminated and insulating to each other.

For solving the problem above, the present invention adopts another embodiment providing a method of manufacturing an array substrate. The method includes: providing a base substrate; forming a TFT on the base substrate, comprising a source and a drain; forming a data line electrically connected with a source; forming a transparent conductive layer between the data line and the pixel electrode; and forming a pixel electrode electrically connected with a drain, wherein the data line and the pixel electrode are set on different layers, and the data line, the transparent conductive layer, and the pixel electrode are laminated and insulating to each other.

The benefit of the present invention, distinct from the conventional art, is to set the transparent conductive layer between the data line and the pixel electrode. The transparent conductive layer includes shield effect to the pixel electrode so it reduces electric field interference generated by the data line to the pixel electrode.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
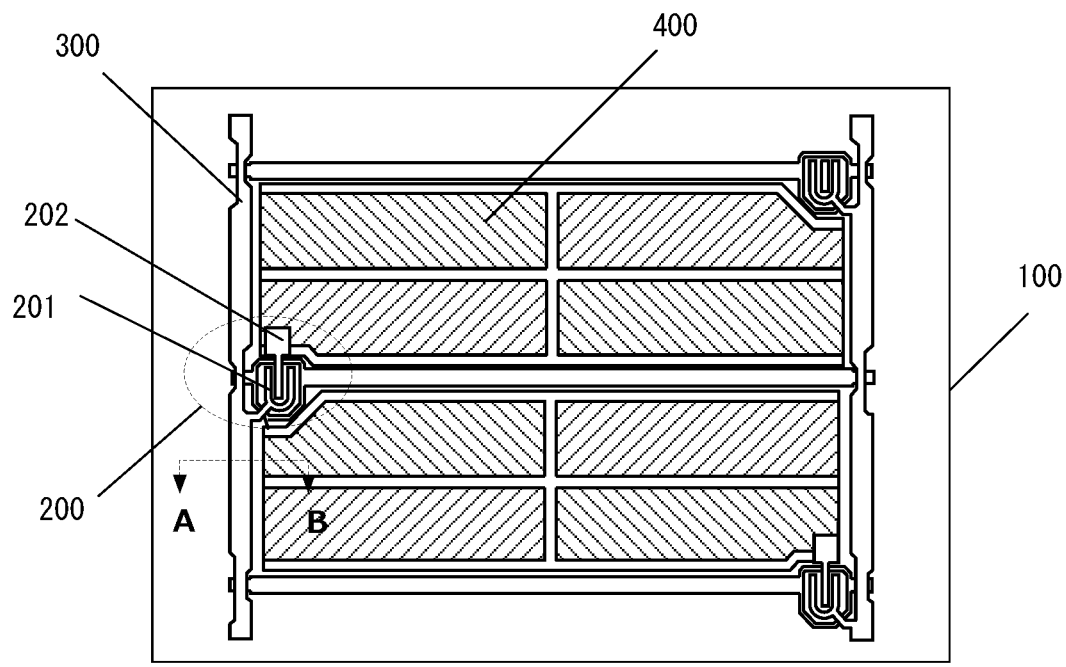
FIG. 1 is a top view of an array substrate in accordance with an embodiment of the present invention.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Figure 2:
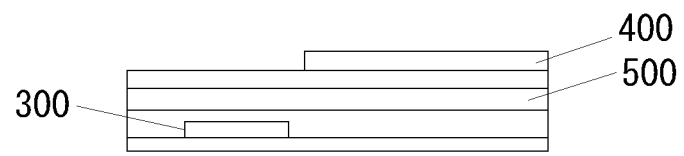
FIG. 2 is a cross-sectional view of the array substrate along line A-B shown in FIG. 1.

Referring FIGS. 1 and 2, FIG. 1 is a top view of an array substrate in accordance with an embodiment of the present invention. FIG. 2 is a cross-sectional view of the array substrate along line A-B shown in FIG. 1. The array substrate includes: a base substrate 100, a thin-film transistor (TFT) 200, a data line 300, a pixel electrode 400, and a transparent conductive layer 500.

The base substrate 100 has excellent optical performance, higher transparency, and lower reflectivity, and can be made of glass material.

The TFT 200 includes a source 201 electrically connected with the data line 300, and a 400. When the TFT 200 is opened, data signal is inputted to the source 201 from the data line 300 and passes through the drain 201 to be inputted in to the pixel electrode 400.

The data line 300 and the pixel electrode 400 are set on different layers. In general, the data line 300 and the source 201 of the TFT 200 are located on the same layer and made of the same metal material. The transparent conductive layer 500 is between the data line 300 and the pixel electrode 400. The transparent conductive layer 500 provides shield effect to the pixel electrode 400 so it reduces electric field interference generated by the data line 300 to the pixel electrode 400.

The data line 300, the pixel electrode 400, and the transparent conductive layer 500 are laminated and insulating to each other. Namely, the data line 300, the pixel electrode 400, and the transparent conductive layer 500 are on different layers.

It explains that the data line 300 is set under the pixel electrode 400 in this embodiment. The data line 300 is set close to the base substrate 100 and the pixel electrode 400 is set far away from the base substrate. The data line 300 and the pixel electrode 400 are on the same side of the base substrate 100. The embodiment of the present invention, however, is not limited and the data line 300 can be set on above the pixel electrode 400 according to the requirement.

In the embodiment above, the transparent conductive layer 500 is set between the data line 300 and the pixel electrode 400. The transparent conductive layer 500 provides shield effect to the pixel electrode 400 so it reduces electric field influence generated by the data line 300 to the pixel electrode 400. It can reduce crosstalk and flicker on the pictures and improve quality of the pictures.

In an appliance of the embodiment above, material of the transparent conductive layer 500 can be ITO. In other appliances, the material of the transparent conductive layer 500 can be other transparent conductive materials such as TZO and $In_2O_3$. The materials of the transparent conductive layer 500 are not limited.

Figure 3:
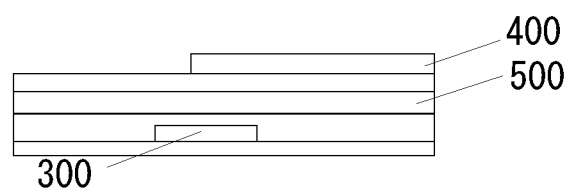
FIG. 3 is a cross-sectional view of the array substrate along line A-B in an appliance shown in FIG. 1.

Referring FIG. 3, in another appliance of the embodiment above, a vertical projection of the data line 300 overlaps that of the pixel electrode 400 at the same flat.

For ultra-high resolution panel such as 39"16K8K High Vertical Alignment (HVA) LCD panel which is developing, width thereof is merely 18.75 μm. The vertical projection of the data line 300 overlaps that of the pixel electrode 400 at the same flat for ensuring enough aperture ratio. It can be understood that area of the overlapped vertical projection is not limited. The vertical projection of the data line 300 can fully overlap that of the pixel electrode 400 or a part of the pixel electrode 400.

In this embodiment, the transparent conductive layer 500 includes a through hole (not shown). The pixel electrode 400 is electrically connected with the drain 201 of the TFT 200 by the through hole.

In this embodiment, the array substrate further includes a common electrode (not shown). The transparent conductive layer 500 is electrically connected with the common electrode, and includes a potential the same as that of the common electrode. Namely, the transparent conductive layer 500 and the common electrode have zero potential so the transparent conductive layer 500 can shield the pixel electrode 400 and it can avoid clustering electric charges on the transparent conductive layer 500. In addition, a person skilled in the art can understand that the common electrode can be set on a color filter substrate opposite to the array substrate. The common electrode can be set on the array substrate and the transparent conductive layer 500 can be electrically connected with the common electrode by a common electrode line so it has the same potential as that of the common electrode.

Optionally, in this embodiment, when the array substrate includes multiple TFTs 200, the transparent conductive layers 500 corresponding to different pixel electrodes 400 can be the same transparent conductive layer or different transparent conductive layers. The transparent conductive layer 500 corresponding to different pixel electrodes 400 being the same transparent conductive layer is that the transparent conductive layers 500 corresponding to different pixel electrodes 400 are on the same layer, and they are continuous. Namely, a vertical projection of the transparent conductive layers 500 covers a whole face of the array substrate. The transparent conductive layer 500 corresponding to different pixel electrodes 400 being different transparent conductive layers is that the transparent conductive layers 500 corresponding to different pixel electrodes 400 are separate and not a whole layer. When the transparent conductive layers 500 corresponding to different pixel electrodes 400 is not the same transparent conductive layer, the different transparent conductive layers 500 are electrically connected among each other and have the same electric potential.

In this embodiment, the transparent conductive layer 500 is between the layers where the data line 300 and the pixel electrode 400 are located. A vertical projection of the transparent conductive layer 500 fully covers that of the pixel electrode 400 at the same flat for a single pixel unit particularly. Namely, the vertical projection of the transparent conductive layer 500 fully covers that of a pixel aperture region and it optimizes liquid crystal alignment.

Figure 4:
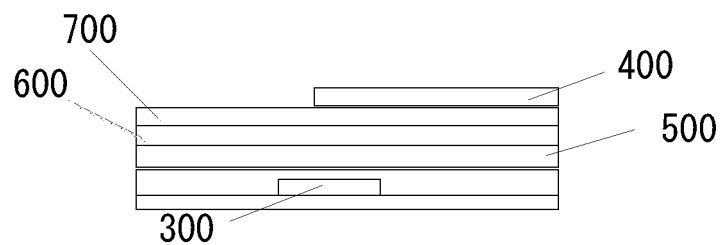
FIG. 4 is a cross-sectional view of an array substrate along line A-B in accordance with another embodiment of the present invention.

Referring FIG. 4, in another embodiment of the present array substrate, the array substrate further includes a color filter layer 600 and a flat protective layer 700.

The color filter layer 600 and the flat protective layer 700 are between the layers where the transparent conductive layer 500 and the pixel electrode 400.

The color filter layer 600 is located on a side of the transparent conductive layer 500 far away from the data line 300, and the flat protective layer 700 is located on a side of the color filter layer 600 far away from the transparent conductive layer 500.

Particularly, the flat protective layer 700 is an organic-material coating layer, has thickness of 2-3 μm, and performs protection and flatting to the color filter layer 600. In an appliance, a material of the flat protective layer 700 is polyfluoroalkoxy (PFA) having chemical corrosion proof and high-temperature resistance.

In this embodiment, the color filter layer 600 is set on the array substrate so it can effectively solve light leakage resulted from alignment deviation in boxing and apparently promote aperture ratio.

Figure 5:
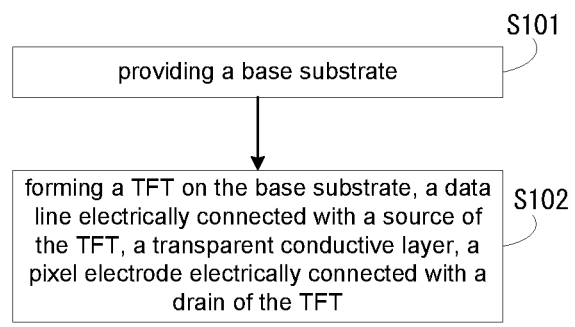
FIG. 5 is a flow chart of a method of manufacturing an array substrate in accordance with an embodiment of the present invention.

Referring to FIG. 5, FIG. 5 is a flow chart of a method of manufacturing an array substrate in accordance with an embodiment of the present invention. The method includes:

S101: providing a base substrate.

The base substrate 100 has excellent optical performance, higher transparency, and lower reflectivity. It can be made of glass, for example.

S102: forming a TFT 200 on the base substrate 100, a data line 300 electrically connected with a source 201 of the TFT 200, a transparent conductive layer 500, a pixel electrode 400 electrically connected with a drain 202 of the TFT 200.

The data line 300 and the pixel electrode 400 are set on different layers. The transparent conductive layer 500 is between the layers where the data line 300 and the pixel electrode 400 are located. The data line 300, the transparent conductive layer 500, and the pixel electrode 400 are laminated and insulating to each other.

Optionally, a material of the transparent conductive layer 500 is ITO in this embodiment.

Optionally, in an appliance, after forming the transparent conductive layer 500 and before forming the pixel electrode 400, it further includes:

S103: forming a color filter layer 600 and a flat protective layer 700 covering the color filter layer 600 in order.

Particularly, the color filter layer 600 is located on a side of the transparent conductive layer 500 far away from the data line 300, and the flat protective layer 700 is located on a side of the color filter layer 600 far away from the transparent conductive layer 500.

Optionally, the flat protective layer 700 performs protection and flatting to the color filter layer 600. In an appliance, a material of the flat protective layer 700 is polyfluoroalkoxy (PFA) having chemical corrosion proof and high-temperature resistance.

The method of manufacturing an array substrate of the present invention is the method of manufacturing the array substrate in one of the embodiments of above. The particular array substrate structure can refer to the embodiments above. It is not iterated.

In summary, distinct from the conventional art, the array substrate of the present invention is to set the transparent conductive layer 500 between the data line 300 and the pixel electrode 400 so. it can easily reduce electric field interference generated by the data line 300 to the pixel electrode 400.

It is noted that it expands dimension of the layer and the region for clear in the figures. It is understood that each layer is not limited in one element and can include multiple elements. In addition, it is understood that when the element or the layer is on "one side" of another element or another layer, it can be on other elements directly or exist at the middle layer.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An array substrate, comprising:
a base substrate;
a thin-film transistor (TFT) on the base substrate, comprising a source and a drain;
a data line electrically connected with the source;
a pixel electrode electrically connected with the drain;
a transparent conductive layer between the data line and the pixel electrode, wherein the pixel electrode is electrically connected with the drain; and
a color filter layer and a flat protective layer between the transparent conductive layer and the pixel electrode, wherein color filter layer is located on a side of the transparent conductive layer far away from the data line, and the flat protective layer is located on a side of the color filter layer far away from the transparent conductive layer;
wherein the data line and the pixel electrode are set on different layers, a vertical projection of the data line overlaps that of the pixel electrode at the same flat, and the data line, the transparent conductive layer, and the pixel electrode are laminated and insulating to each other.

2. The array substrate of claim 1, wherein a material of the transparent conductive layer is ITO.

3. The array substrate of claim 1, wherein a material of the flat protective layer is polyfluoroalkoxy (PFA).

4. An array substrate, comprising:
a base substrate;
a thin-film transistor (TFT) on the base substrate, comprising a source and a drain;
a data line electrically connected with the source;
a pixel electrode electrically connected with the drain;
a transparent conductive layer between the data line and the pixel electrode; and
a color filter layer and a flat protective layer between the transparent conductive layer and the pixel electrode, wherein the color filter layer is located on a side of the transparent conductive layer far away from the data line, and the flat protective layer is located on a side of the color filter layer far away from the transparent conductive layer;
wherein the data line and the pixel electrode are set on different layers, and the data line, the transparent conductive layer, and the pixel electrode are laminated and insulating to each other.

5. The array substrate of claim 4, wherein a vertical projection of the data line overlaps that of the pixel electrode at the same flat.

6. The array substrate of claim 4, wherein the pixel electrode is electrically connected with the drain.

7. The array substrate of claim 4, wherein a material of the transparent conductive layer is ITO.

8. The array substrate of claim 4, wherein a material of the flat protective layer is polyfluoroalkoxy (PFA).

9. A method of manufacturing an array substrate, comprising steps of:
   providing a base substrate;
   forming a TFT on the base substrate, comprising a source and a drain;
   forming a data line electrically connected with the source;
   forming a transparent conductive layer between the data line and the pixel electrode; and
   forming a pixel electrode electrically connected with the drain,
   wherein the data line and the pixel electrode are set on different layers, and the data line, the transparent conductive layer, and the pixel electrode are laminated and insulating to each other;
   after forming the transparent conductive layer and before forming the pixel electrode, further comprising forming a color filter layer and a flat protective layer covering the color filter layer in order, wherein the color filter layer is located on a side of the transparent conductive layer far away from the data line, and the flat protective layer is located on a side of the color filter layer far away from the transparent conductive layer.

10. The method of claim 9, wherein a material of the transparent conductive layer is ITO.

\* \* \* \* \*